United States Patent

Yamaguchi et al.

Patent Number: 5,728,763
Date of Patent: Mar. 17, 1998

[54] THERMOSETTING RESIN COMPOSITION FOR SEMICONDUCTOR DEVICES

[75] Inventors: Miho Yamaguchi; Mitsuyoshi Shirai; Yoshitada Morikawa; Yoshiaki Mitsuoka; Michio Komoto, all of Osaka, Japan

[73] Assignee: Nitto Denko Corporation, Osaka, Japan

[21] Appl. No.: 748,911

[22] Filed: Nov. 15, 1996

Related U.S. Application Data

[62] Division of Ser. No. 424,195, Apr. 19, 1995, Pat. No. 5,624,989.

Foreign Application Priority Data

Aug. 20, 1993 [JP] Japan ................................. 5-206632

[51] Int. Cl.$^6$ ................................................ C08K 3/22
[52] U.S. Cl. .................... 524/430; 524/413; 524/431; 524/432; 524/442; 524/449; 524/451
[58] Field of Search .................................. 524/405, 413, 524/431, 434, 435, 437, 440, 442, 445, 449, 451

[56] References Cited

U.S. PATENT DOCUMENTS 4,885,329 12/1989 Tominaga et al. .................... 524/431
4,963,291 10/1990 Bercaw ................................ 524/440

OTHER PUBLICATIONS

Grant & Hackh's Chemical Dictionary, pp. 369 & 573, Fifth Ed. McGraw-Hill Book Company, 1987.

Primary Examiner—Tae Yoon
Attorney, Agent, or Firm—Sughrue, Mion, Zinn, Macpeak & Seas, PLLC

[57] ABSTRACT

A semiconductor device obtained by encapsulating a semiconductor element with a thermosetting resin composition comprising a thermosetting resin (Component I) and a hardener (Component II) having the following components III and IV incorporated therein. The semiconductor device is thus provided with a high heat resistance at infrared reflow step and a high flame retardance, showing a drastically enhanced reliability.

(III) A metal hydroxide represented by the following general formula (1):

$$n(M_aO_b) \cdot cH_2O \qquad (1)$$

wherein M represents a metallic element; a, b and c each represents a positive number; and n represents a positive number of 1 or more, with the proviso that when $M_aO_b$ is repeated, the plurality of M's may be the same or different and that a and b may be the same or different; and (IV) a metal oxide represented by the following general formula (2):

$$n'(Q_dO_e) \qquad (2)$$

wherein Q represents a metallic element belonging to the group selected from the group consisting of Groups IVa, Va, VIa, VIIa, VIII, Ib and IIb in the Periodic Table; d and e each represents a positive number; and n' represents a positive number of 1 or more, with the proviso that when $Q_dO_e$ is repeated, the plurality of Q's may be the same or different and that d and e may be the same or different.

2 Claims, No Drawings

THERMOSETTING RESIN COMPOSITION FOR SEMICONDUCTOR DEVICES

This is a divisional of application Ser. No. 08/424,195 filed Apr. 19, 1995 now U.S. Pat. No. 5,624,989.

TECHNICAL FIELD

The present invention relates to a semiconductor device which exhibits a high temperature reliability, a high heat resistance at reflow step and an excellent flame retardance.

BACKGROUND OF THE INVENTION

Semiconductor elements such as transistor, IC and LSI have heretofore been encapsulated with ceramic package or the like to obtain semiconductor devices. The recent trend is for more semiconductor elements to be encapsulated with a plastic package from the standpoint of cost and mass productivity. For such a resin encapsulating, epoxy resin compositions have heretofore been used with good results. However, the technical innovation in the field of semiconductors has brought about an increase in the size of elements and a reduction in the diameter of lead wires along with the enhancement of the degree of integration, showing a trend for smaller and thinner packages. With this trend, a higher reliability has been desired for encapsulating materials.

On the other hand, electronic components such as semiconductor device need to conform to UL94-V0, which is a flame retardance specification. Heretofore, it has been a common practice to incorporate a brominated epoxy resin and antimony oxide in an epoxy resin composition for encapsulating semiconductors in order to provide the epoxy resin composition with a flame retardance.

However, the above-described flame-retarding technique has two main problems.

The first problem includes environmental hazards such as the toxicity of antimony trioxide itself, the harmfulness of toxic gases generated during combustion, e.g., hydrogen bromide, bromic gas and brominated antimony, to human body, the corrosion of apparatus by these toxic gases, and the difficulty in disposal of industrial wastes discharged at the semiconductor element encapsulating step and used semiconductor devices.

Referring to the second problem, when a semiconductor device employing the above-described flame-retarding technique is allowed to stand at high temperatures for a prolonged period of time, it releases bromine which then corrodes aluminum wirings on the semiconductor element, resulting in failures in the semiconductor device and hence a reduction in high temperature reliability.

In order to solve these problems, an approach has been proposed which comprises the use of a non-halogen and non-antimony metal hydroxide as an inorganic flame retardant. However, this approach gives a rise to another problem.

The first problem is attributable to swelling caused by dehydration reaction at the postcuring step. A surface mounting has been mainly used as the method for mounting a semiconductor package. Thus, solder dipping process, infrared reflow process, vapor phase reflow process, etc. are employed. In these processes, the package is exposed to high temperatures (normally 215° to 260° C.). Therefore, in a semiconductor device encapsulated with a resin composition comprising a large amount of a metal hydroxide incorporated therein, water content produced by dehydration reaction and a minute amount of water content which has penetrated into the semiconductor device through the encapsulating resin are suddenly vaporized, resulting in the reduction of the reliability guarantee for humidity resistance. Further, the encapsulating resin swells, making it impossible to package the semiconductor element.

Referring to the second problem, the high temperature reliability guarantees the function of semiconductors in an atmosphere of as high as 150° to 200° C. Semiconductor elements which generate a large amount of heat or semiconductor devices adapted to be mounted in the vicinity of automobile engine are disadvantageous in that they are susceptible to reduction of high temperature reliability due to dehydration reaction after prolonged use.

As described above, the conventional flame-retarding technique gives rise to the above-described problems. It has thus been keenly desired to develop a flame-retarding technique which is safe and unharmful to human body and environment and insusceptible to the reduction of the crack resistance due to the dehydration of metal hydroxide at infrared reflow step and corrosion of aluminum wirings on the semiconductor element or reduction of high temperature reliability after prolonged storage in an atmosphere of a high temperature and humidity.

In the light of such circumstances, the present invention has been worked out. An object of the present invention is to provide a semiconductor device which exhibits a high reliability at high temperatures and high heat resistance, flame retardance and safety at infrared reflow step.

DISCLOSURE OF THE INVENTION

In order to accomplish the above-described object of the present invention, the first object of the present invention is to provide a semiconductor device encapsulated with a thermosetting resin composition containing the following components (I) to (IV):

(I) a thermosetting resin;

(II) a hardener;

(III) a metal hydroxide represented by the following general formula (1):

$$n(M_aO_b) \cdot cH_2O \qquad (1)$$

[In the general formula (1), M represents a metallic element; a, b and c each represents a positive number; and n represents a positive number of 1 or more, with the proviso that when $M_aO_b$ is repeated, the plurality of M's may be the same or different and that a and b may be the same or different.]

The metallic element M in the above general formula (1) may be a nonmetal showing a metallic characteristic, such as boron.

(IV) a metal oxide represented by the following general formula (2):

$$n'(Q_dO_e) \qquad (2)$$

[In the general formula (2), Q represents a metallic element belonging to the group selected from the group consisting of Groups IVa, Va, VIa, VIIa, VIII, Ib and IIb in the Periodic Table; d and e each represents a positive number; and n' represents a positive number of 1 or more, with the proviso that when $Q_dO_e$ is repeated, the plurality of Q's may be the same or different and that d and e may be the same or different.]

In the above general formula (1), when n is 1, the component (III) is a single metal hydroxide. When n is 2 or more, the component (III) is a composite metal hydroxide.

An embodiment of the thermosetting resin composition comprises at least one of composite metal hydroxides represented by the following general formulae (3) and (4) as the metal hydroxide (III):

$$x(A_aO_b) \cdot y(B_dO_e) \cdot cH_2O \quad (3)$$

[In the general formula (3), A and B represent different metallic elements; x, y, a, b, d and e each represents a positive number; and c represents a positive number of more than 1, with the proviso that x, y, a, b, d and e may be the same or different.]

$$x(C_aO_b) \cdot y(D_dO_e) \cdot z(E_fO_g) \cdot cH_2O \quad (4)$$

[In the general formula (4), C, D and E represent different metallic elements; x, y, z, a, b, d, e, f and g each represents a positive number; and c represents a positive number of more than 1, with the proviso that x, y, z, a, b, d, e, f and g may be the same or different.]

In addition to the composite metal hydroxides represented by the general formulae (3) and (4), another embodiment of the thermosetting resin composition comprises a metal hydroxide represented by the following general formula (5):

$$M_aO_b \cdot cH_2O \quad (5)$$

[In the general formula (5), M represents a metallic element; and a, b and c each represents a positive number, with the proviso that a and b may be the same or different.]

The second object of the present invention is to provide a semiconductor device encapsulated with a thermosetting resin composition containing the following components (I) to (III):

(I) a thermosetting resin;
(II) a hardener; and
(III) at least one of a composite metal hydroxide having a dehydration initiation temperature of not lower than 260° C. represented by the following general formula (3) and a composite metal hydroxide represented by the following general formula (4):

$$x(A_aO_b) \cdot y(B_dO_e) \cdot cH_2O \quad (3)$$

[In the general formula (3), A and B represent different metallic elements; x, y, a, b, d and e each represents a positive number; and c represents a positive number of more than 1, with the proviso that x, y, a, b, d and e may be the same or different.]

$$x(C_aO_b) \cdot y(D_dO_e) \cdot z(E_fO_g) \cdot cH_2O \quad (4)$$

[In the general formula (4), C, D and E represent different metallic elements; x, y, z, a, b, d, e, f and g each represents a positive number; and c represents a positive number of more than 1, with the proviso that x, y, z, a, b, d, e, f and g may be the same or different.]

The third object of the present invention is to provide a semiconductor device encapsulated with the thermosetting resin composition defined in the first and second objects comprising an organic flame retardant incorporated therein.

The inventors made studies to obtain a encapsulating resin composition having a high reliability at high temperatures and high heat resistance and flame retardance at infrared reflow step, to say nothing of safety. In the course of the studies, various compounds were examined to find a new flame retardant as an alternative to the conventional flame retardants. As a result, it was found that the following several mixtures are useful as flame retardants. (1) Firstly, a mixture of a metal hydroxide represented by the above general formula (1) and a metal oxide represented by the above general formula (2) can be used. (2) The metal hydroxide represented by the general formula (1) may be at least one of composite metal hydroxides represented by the above general formulae (3) and (4). (3) A mixture of the at least one of these two composite metal hydroxides and a metal hydroxide represented by the above general formula (5) can be used. (4) Further, at least one of a composite metal hydroxide having a dehydration initiation temperature of not lower than 260° C. represented by the general formula (3) and a composite metal hydroxide represented by the general formula (4) can be used. (5) In addition to the mixtures (1) to (4), an organic flame retardant can be incorporated. When the above mixtures, which are safe and unharmful to human being, are used as flame retardants, a sufficient flame retardance can be provided by the use of a metal hydroxide in an amount smaller than in the single use of a metal hydroxide. It was thus found that a encapsulating resin-forming material having a high reliability at high temperatures and excellent heat resistance and flame retardance at infrared reflow step can be obtained. The present invention has been worked out.

In the above general formulae (1) to (5), H represents a hydrogen atom, and O represents an oxygen atom.

The present invention will be further described hereinafter.

The thermosetting resin composition used in the present invention can be prepared from a thermosetting resin (Component I), a hardener (Component II), optionally with a hardening accelerator and an inorganic filler, and a mixture which serves as a flame retardant. In general, it is in the form of powder or tablet obtained by pelletizing powder.

Examples of the thermosetting resin (Component I) include epoxy resin, polymaleimide resin, unsaturated polyester resin, and phenolic resin. In particular, epoxy resin and polymaleimide resin are preferably used in the present invention.

The epoxy resin is not specifically limited. As such an epoxy resin there may be used a known compound such as bisphenol A type, phenolic novolak type and cresol novolak type epoxy resins.

The polymaleimide resin is not specifically limited. As such a polymaleimide resin there may be used a known compound having two or more maleimide groups per molecule. Examples of such a polymaleimide resin include N,N'-4,4'-diphenylmethanebismaleimide, and 2,2,-bis-[4-(4-maleimidephenoxy)phenyl]propane.

The hardener (Component II) used with the thermosetting resin (Component I) is not specifically limited if an epoxy resin is used. As such a hardener there may be used a known compound. For example, a phenolic resin is preferably used. As the phenolic resin there is preferably used a phenolic novolak. Examples of such a phenolic novolak include phenolic novolak, cresol novolak, and naphtholic novolak.

The hardener used for the thermosetting polymaleimide resin is not specifically limited. As such a hardener there may be used a known compound. For example, alkenylphenols obtained by the reaction of the epoxy resin hardener with a halogenated allyl in the presence of an alkali or amines can be used.

The retardant used with the thermosetting resin (Component I) and hardener (Component II) is roughly divided into the following three embodiments.

The first embodiment of the flame retardant is a mixture of a metal hydroxide represented by the following general formula (1) and a metal oxide represented by the following general formula (2):

$$n(M_aO_b) \cdot cH_2O \quad (1)$$

[In the general formula (1), M represents a metallic element; a, b and c each represents a positive number; and n represents a positive number of 1 or more, with the proviso that when $M_aO_b$ is repeated, the plurality of M's may be the same or different and that a and b may be the same or different.]

$$n'(Q_dO_e) \quad (2)$$

[In the general formula (2), Q represents a metallic element belonging to the group selected from the group consisting of Groups IVa, Va, VIa, VIIa, VIII, Ib and IIb in the Periodic Table; d and e each represents a positive number; and n' represents a positive number of 1 or more, with the proviso that when $Q_dO_e$ is repeated, the plurality of Q's may be the same or different and that d and e may be the same or different.]

The first embodiment contains the combined use of a single metal hydroxide (n=1) and a metal oxide (case a of the first embodiment) and the combined use of a composite metal hydroxide (n=2 or more) and a metal oxide (case b of the first embodiment).

The case a of the first embodiment will be further described hereinafter.

In the general formula (1), examples of the metallic element represented by M in the metal hydroxide include Al, Mg, Ca, Ni, Co, Sn, Zn, Cu, Fe, Ti and B.

Specific representative examples of the metal hydroxide represented by the general formula (1) (wherein n is 1) include the following hydroxides of single metallic element: $Al_2O_3 \cdot 3H_2O$, $Al_2O_3 \cdot H_2O$, $Al_2O_3 \cdot cH_2O$ ($0<c\leq3$), $MgO \cdot H_2O$, $MgO \cdot cH_2O$ ($0<c\leq$), $CaO \cdot H_2O$, $CaO \cdot cH_2O$ ($0<c\leq1$), $Ni_2O \cdot H_2O$, $NiO \cdot H_2O$ ($0<c\leq4$), $Ni_2O_3 \cdot 3H_2O$, $Ni_2O_3 \cdot H_2O$, $NiO_2 \cdot cH_2O$ ($0<c\leq2$), $NiO_b \cdot cH_2O$ ($0.5\leq b\leq2$, $0<c\leq2$), $CoO \cdot H_2O$, $Co_2O_3 \cdot 3H_2O$, $Co_2O_3 \cdot H_2O$, $Co_3O_4 \cdot cH_2O$ ($0<c\leq4$), $CoO_2 \cdot cH_2O$ ($0<c\leq2$), $CoO_b \cdot cH_2O$ ($1\leq b\leq2$, $0<c\leq2$), $Pb_2O \cdot H_2O$ ($0<c\leq1$), $PbO \cdot H_2O$, $Pb_2O_3 \cdot cH_2O$ ($0<c\leq3$), $PbO_2 \cdot 2H_2O$, $PbO_b \cdot cH_2O$ ($0.5\leq b\leq2$, $0<c\leq2$), $SnO \cdot H_2O$, $SnO_2 \cdot 2H_2O$, $SnO_b \cdot cH_2O$ ($1\leq b\leq2$, $0<c\leq2$), $ZnO \cdot H_2O$, $ZnO \cdot cH_2O$ ($0<c\leq1$), $FeO \cdot H_2O$, $Fe_3O_4 \cdot 4H_2O$, $Fe_2O_3 \cdot 3H_2O$, $Fe_2O_3 \cdot H_2O$, $FeO_b \cdot cH_2O$ ($1\leq b\leq1.5$, $0<c\leq1.5$), $Cu_2O \cdot H_2O$, $CuO \cdot H_2O$, $CuO_b \cdot cH_2O$ ($0.5\leq b\leq1$, $0<c\leq1$)

Two or more of these metal hydroxides may be used in combination. When two or more of these metal hydroxides are used in combination, it is effective to mechanically mix them.

Particularly preferred among the metal hydroxides represented by the general formula (1) are $Al_2O_3 \cdot H_2O$, $Al_2O_3 \cdot 3H_2O$, and $MgO \cdot H_2O$.

In general, the sum of the weight of the inorganic filler, the metal hydroxide and the metal oxide is determined to be 60 to 90% by weight based on the total weight of the thermosetting resin composition.

The content of the metal hydroxide is preferably determined to be 5 to 40% by weight based on the total weight of the thermosetting resin composition (the residual part obtained by subtracting the weight of the metal hydroxide from the sum of the weight of the inorganic filler, the metal hydroxide and the metal oxide contains the weight of the metal oxide and the inorganic filler). In other words, if the content of the metal hydroxide is below 5% by weight, it exerts an insufficient flame retarding effect. On the contrary, if the content of the metal hydroxide exceeds 40% by weight, it tends to reduce the reliability at high temperatures and the heat resistance at reflow step. Further, these special metal hydroxides also serve as fillers. The use of these metal hydroxides makes it possible to reduce the content of the conventionally used inorganic filler.

The thermosetting resin composition comprising a metal hydroxide represented by the general formula (1) preferably has a chlorine ion concentration of not more than 100 ppm per g of thermosetting resin composition in the extract obtained as follows. In some detail, 5 g of the thermosetting resin composition and 50 cc of distilled water are put into a specified extractor. This extractor is then allowed to stand in a 160° C. oven for 20 hours to obtain an extract. The extract is then subjected to ion chromatography to measure the chlorine ion content (x). The chlorine ion content (x) thus obtained is that of the thermosetting resin composition diluted by a factor of 10. Accordingly, the chlorine ion content per g of thermosetting resin composition is calculated by the following equation:

Chlorine ion content (ppm) per g of thermosetting resin composition=$x \times (50/5)$ This is because that if the chlorine ion content in the extract of the thermosetting resin composition is high, it corrodes the element, lead frame, etc. or deteriorates the moisture resistance of the element.

The metal hydroxide represented by the general formula (1) preferably has a chlorine ion concentration of not more than 300 ppm per g of metal hydroxide in the extract obtained as follows. In some detail, 5 g of the metal hydroxide and 50 cc of distilled water are put into a specified extractor. This extractor is then allowed to stand in a 160° C. oven for 20 hours to obtain an extract. The extract is then subjected to ion chromatography to measure the chlorine ion content (x). The chlorine ion content (x) thus obtained is that of the metal hydroxide diluted by a factor of 10. Accordingly, the chlorine ion content per g of metal hydroxide is calculated by the following equation:

Chlorine ion content (ppm) per g of metal hydroxide=$x \times (50/5)$

This is because that if the chlorine ion content in the extract of the metal hydroxide is high, it corrodes the element, lead frame, etc. or deteriorates the moisture resistance of the element.

The metal oxide represented by the general formula (2) can be obtained, e.g., by completely dehydrating the metal hydroxide represented by the general formula (1).

The metallic element represented by Q in the metal oxide represented by the general formula (2) is a metal belonging to a group selected from the group consisting of Groups IVa, Va, VIa, VIIa, VIII, Ib and IIb in the Periodic Table. Examples of such a metal include iron, cobalt, nickel, palladium, copper, zinc, and cadmium. These metallic elements may be selected singly or in combination.

Specific representative examples of the metal oxide include MgO, CaO, $Ni_2O$, NiO, $Ni_3O_4$, $Ni_2O_3$, $NiO_2$, $NiO_b$ ($0.5\leq b\leq2$), CoO, $Co_2O_2$, $Co_3O_4$, $CoO_2$, $CoO_b$ ($1\leq b\leq2$), $Pb_2O$, PbO, $Pb_2O_3$, $PbO_2$, $PbO_b$ ($0.5\leq b\leq2$), SnO, $SnO_2$, $SnO_b$ ($1\leq b\leq2$), ZnO, FeO, $Fe_3O_4$, $Fe_2O_3$, $FeO_b$ ($1\leq b\leq1.5$), $Cu_2O$, CuO, $CuO_b$ ($0.5\leq b\leq1$), TiO, $Ti_2O_3$, $TiO_2$, $TiO_b$ ($1\leq b\leq2$), PdO, $Pd_2O_3$, $PdO_2$, and $PdO_b$ ($1\leq b\leq2$).

Specific representative examples of the metal oxide represented by the general formula (2) wherein the plurality of Q's are different metallic elements include $Al_2O_3 \cdot MgO$, $s(Al_2O_3) \cdot 1-s(MgO)$ ($0<s<1$), $s(Al_2O_3) \cdot 1-s(CaO)$ ($0<s<1$), $s(Al_2O_3) \cdot 1-s(NiO)$ ($0<s<1$), $s(Al_2O_3) \cdot 1-s(TiO_2)$($0<s<1$), $s(MgO) \cdot 1-s(NiO)$ ($0<s<1$), $s(MgO) \cdot 1-s(CoO)$ ($0<s<1$), s(MgO).1-s(CaO) (0<s<1), s(MgO).1-s(FeO) (0<s<1), s($Al_2O_3$).t(MgO).u(NiO) (0<s<1, 0<t<1, 0<u<1, s+t+u=1), and s(MgO).u($Fe_2O_3$) (0<s<1, 0<t<1, 0<u<1, s+t+u=1). If the metal oxide contains two or more metallic elements, these specific metal oxides may be in the form of solid solution obtained by mixing them on an atomic basis or in the form of mixture of two or more crystals. These metal oxides may be used alone or in combination. When two or more of these metal oxides are used in combination, it is effective to mechanically mix them.

Particularly preferred among the metal oxides are FeO, $Fe_3O_4$, CoO, $Co_2O_3$, NiO and $Ni_3O_4$, which can exert a flame retarding effect even if the amount of the metal hydroxide used therewith is reduced.

The content of the metal oxide is preferably determined to be 5 to 80% by weight based on the total weight of the thermosetting resin composition (the residual part obtained by subtracting the weight of the metal oxide from the sum of the weight of the metal hydroxide, the inorganic filler and the metal oxide contains the weight of the metal hydroxide and the inorganic filler). In other words, if the content of the metal oxide falls below 5% by weight, it causes the metal hydroxide to exert an insufficient flame retarding effect. On the contrary, if the content of the metal oxide exceeds 80% by weight, it tends to reduce the flame retardance of the resin product.

The sum of the weight of the metal hydroxide and metal oxide is preferably determined to be 10 to 80% by weight, particularly 15 to 50% by weight, of the total weight of the thermosetting resin composition. In other words, if the sum of the weight of the metal hydroxide and metal oxide falls below 10% by weight, it exerts an insufficient flame retarding effect. On the contrary, if it exceeds 80% by weight, it tends to reduce the reliability at high temperatures and the heat resistance at reflow step.

The proportion of the metal hydroxide (X) and metal oxide (Y), if they are used in combination, are preferably determined to be 10 to 30% by weight and 5 to 40% by weight based on the total weight of the thermosetting resin composition, respectively.

The combined use of the metal hydroxide represented by the general formula (1) and the metal oxide represented by the general formula (2) as case a of the first embodiment exerts an excellent flame retarding effect.

The case b of the first embodiment will be further described hereinafter. In this case, at least one of composite metal hydroxides represented by the following general formulae (3) and (4) is used as the metal hydroxide represented by the general formula (1). As the metal oxide used with the metal hydroxide there may be used the same metal oxide as used in the case a of the first embodiment.

$$x(A_aO_b).y(B_dO_e).cH_2O \quad (3)$$

[In the general formula (3), A and B represent different metallic elements, x, y, a, b, d and e each represents a positive number, and c represents a positive number of more than 1, with the proviso that x, y, a, b, d and e may be the same or different.]

$$x(C_aO_b).y(D_dO_e).z(E_fO_g).cH_2O \quad (4)$$

[In the general formula (4), C, D and E represent different metallic elements, x, y, z, a, b, d, e, f and g each represents a positive number, and c represents a positive number of more than 1, with the proviso that x, y, z, a, b, d, e, f and g may be the same or different.]

Examples of the metallic elements represented by A, C and D in the composite metal hydroxides represented by the general formulae (3) and (4) include aluminum, magnesium, calcium, nickel, cobalt, tin, zinc, copper, iron, titanium, and boron.

Examples of the metallic elements represented by B and E in the composite metal hydroxides represented by the general formulae (3) and (4) include metals belonging to a group selected from the group consisting of Groups IVa, Va, VIa, VIIa, VIII, Ib and IIb in the Periodic Table.

Specific examples of the composite metal hydroxide represented by the general formula (3) include $Al_2O_3.MgO.4H_2O$, $Al_2O_3.MgO.cH_2O$ (0<c≦4), s($Al_2O_3$).1-s(MgO).$cH_2O$ (0<s<1, 0<c≦), s($Al_2O_3$).1-s(CoO).$cH_2O$ (0<s<1, 0<c≦3), s($Al_2O_3$).1-s(CaO).$cH_2O$ (0<s<1, 0<c≦3), s($Al_2O_3$).1-s(NiO).$cH_2O$ (0<s<1, 0<c≦3), s($Al_2O_3$).1-s($TiO_2$).$cH_2O$ (0<s<1, 0<c≦3), s(MgO).1-s(NiO).$cH_2O$ (0<s<1, 0<c≦1), s(MgO).1-s(CoO).$cH_2O$ (0<s<1, 0<c≦1), s(MgO).1-s(CaO).$cH_2O$ (0<s<1, 0<c≦1), s(MgO).1-s($Fe_2O_3$).$cH_2O$ (0<s<1, 0<c≦3), s(MgO).1-s(FeO).$cH_2O$ (0<s<1, 0<c≦1), and s(CaO).1-s($Fe_2O_3$).$cH_2O$ (0<s<1, 0<c≦3). These composite metal hydroxides may be used singly or in combination. In particular, when two or more of these composite metal hydroxides are used in combination, it is effective to mechanically mix them. In the general formula (3), there are two metallic elements. These special composite metal hydroxides may be in the form of solid solution obtained by mixing them on an atomic basis or in the form of mixture of two crystals.

Among the composite metal hydroxides represented by the general formula (3), the use of those containing Fe, Co and Ni is particularly preferred because it exerts a great flame retarding effect.

Specific examples of the composite metal hydroxide represented by the general formula (4) include s($Al_2O_3$).t(MgO).u(NiO).$cH_2O$ (0<s<1, 0<t<1, 0<u<1, s+t+u=1, 0<c≦3), s($Al_2O_3$).t(CaO).u($SnO_2$).$cH_2O$ (0<s<1, 0<t<1, 0<u<1, s+t+u=1, 0<c≦3), s(MgO).t(CoO).u(NiO).$cH_2O$ (0<s<1, 0<t<1, 0<u<1, s+t+u=1, 0<c≦3), s(CaO).t(ZnO).u(CuO).$cH_2O$ (0<s<1, 0<t<1, 0<u<1, s+t+u=1, 0<c≦3), s(MgO).t(FeO).u($Fe_2O_3$).$cH_2O$ (0<s<1, 0<t<1, 0<u<1, s+t+u=1, 0<c≦3), and s(MgO).t($TiO_2$).u(PdO).$cH_2O$ (0<s<1, 0<t<1, 0<u<1, s+t+u=1, 0<c≦3). These composite metal hydroxides may be used singly or in combination. In particular, when two or more of these composite metal hydroxides are used in combination, it is effective to mechanically mix them. In the general formula (4), there are three metallic elements. These special composite metal hydroxides may be in the form of solid solution obtained by mixing them on an atomic basis or in the form of mixture of three crystals.

Among the composite metal hydroxides represented by the general formula (4), the use of those containing Fe, Co and Ni is particularly preferred because it exerts a great flame retarding effect.

These special composite metal hydroxides represented by the general formulae (3) and (4) also serve as fillers similarly to the metal hydroxide represented by the general formula (1). The use of these metal hydroxides makes it possible to reduce the content of the conventionally used inorganic filler.

In the case b of the first embodiment, the content of the composite metal hydroxides represented by the general formulae (3) and (4) is preferably determined to be 5 to 80% by weight based on the total weight of the thermosetting resin composition. In other words, if this value is below 5% by weight, it causes the composite metal hydroxides to exert an insufficient flame retarding effect. On the other hand, if this value exceeds 80% by weight, it tends to reduce the reliability at high temperatures and the heat resistance at reflow step.

In the case b of the first embodiment, the sum of the weight of the metal hydroxides [general formulae (3) and (4)] and the metal oxide [general formula (2)] is preferably determined to be 10 to 90% by weight, particularly 25 to 90% by weight, based on the total weight of the thermosetting resin composition. In other words, if the sum of the weight of the metal hydroxides and metal oxide is below 10% by weight, it exerts an insufficient flame retarding effect. On the contrary, if it exceeds 90% by weight, it tends to reduce the reliability at high temperatures and the heat resistance at reflow step.

The proportion of the composite metal hydroxide (X) and metal oxide (Y), if they are used in combination, are preferably determined to be 15 to 80% by weight and 10 to 75% by weight based on the total weight of the thermosetting resin composition, respectively.

Thus, it can be thought that the combined use of the composite metal hydroxides represented by the general formulae (3) and (4) and the metal oxide represented by the general formula (2) as the case b of the first embodiment exerts an effect of accelerating carbonization during combustion. In other words, an effect can be exerted of enhancing the flame retardance and reducing the content of the flame retardant as compared with the single use of a composite metal hydroxide. As a result, this mixture exerts an excellent effect as a flame retardant.

Further, in the case b of the first embodiment, the thermosetting resin composition comprising composite metal hydroxides represented by the general formulae (3) and (4) preferably has a chlorine ion concentration of not more than 100 ppm per g of thermosetting resin composition similarly to the case a of the first embodiment. The measurement and calculation of the chlorine ion concentration are conducted in the same manner as in the case a of the first embodiment.

The chlorine ion concentration in the composite metal hydroxide is preferably not more than 300 ppm per g of composite metal hydroxide similarly to the case a of the first embodiment. The measurement and calculation of the chlorine ion concentration are conducted in the same manner as in the case a of the first embodiment.

In the case b of the first embodiment, if the composite metal hydroxides represented by the general formulae (3) and (4) are used, they may be used in combination with a single metal hydroxide represented by the following general formula (5):

$$M_aO_b \cdot cH_2O \qquad (5)$$

[In the general formula (5), M represents a metallic element, and a, b and c each represents a positive number, with the proviso that a and b may be the same or different.]

Specific examples of the single metal hydroxide represented by the general formula (5) include those described as specific examples of the metal hydroxide represented by the general formula (1). These single metal hydroxides may be used singly or in combination.

Referring to the thermal properties of the composite metal hydroxides represented by the general formulae (3) and (4) and the single metal hydroxide represented by the general formula (5), their heat loss at a temperature of 150° C. and dehydration initiation temperature are preferably not higher than 5% by weight and not lower than 200° C., particularly not lower than 260° C., respectively. The heat loss as used herein is determined by thermogravimetry using a thermobalance (in the atmosphere) at a temperature rise rate of 10° C./min. The heat loss measured when the temperature reaches 150° C. is determined in % by weight.

The dehydration initiation temperature as used herein is determined by thermogravimetry using a thermobalance (in the atmosphere) at a temperature rise rate of 10° C./min. It is defined as the temperature at which the heat loss reaches 5% by weight or the temperature at which the differential heat loss value (derivative of the heat loss with respect to time, i.e., heat loss rate) exceeds 0.5%/min, whichever is lower.

The second embodiment will be further described hereinafter. The second embodiment comprises the thermosetting resin (Component I), the hardener (Component II), optionally with a hardening accelerator and an inorganic filler, and the following composite metal hydroxide (III).

(III) at least one of a composite metal hydroxide represented by the following general formula (3) having a dehydration initiation temperature of not lower than 260° C. and a composite metal hydroxide represented by the following general formula (4):

$$x(A_aO_b) \cdot y(B_dO_e) \cdot cH_2O \qquad (3)$$

[In the general formula (3), A and B represent different metallic elements, x, y, a, b, d and e each represents a positive number, and c represents a positive number of more than 1, with the proviso that x, y, a, b, d and e may be the same or different.]

$$x(C_aO_b) \cdot y(D_dO_e) \cdot z(E_fO_g) \cdot cH_2O \qquad (4)$$

[In the general formula (4), C, D and E represent different metallic elements, x, y, z, a, b, d, e, f and g each represents a positive number, and c represents a positive number of more than 1, with the proviso that x, y, z, a, b, d, e, f and g may be the same or different.]

Examples of the composite metal hydroxides represented by the general formulae (3) and (4) include those described above.

The content of the composite metal hydroxides represented by the general formulae (3) and (4) is preferably determined to be 5 to 80% by weight based on the total weight of the thermosetting resin composition. In other words, if this value is below 5% by weight, it exerts an insufficient flame retarding effect. On the other hand, if this value exceeds 80% by weight, it tends to reduce the reliability at high temperatures and the heat resistance at reflow step.

Thus, the second embodiment comprises the composite metal hydroxide alone as a compound which serves as a flame retardant but comprises no metal oxides described in the first embodiment.

The composite metal hydroxide represented by the general formula (3) needs to have a dehydration initiation temperature of not lower than 260° C., particularly preferably not lower than 300° C. In other words, if the dehydration initiation temperature is lower than 260° C., the heat resistance at reflow step is reduced. Referring to the thermal properties of the composite metal hydroxide, the heat loss at a temperature of 150° C. is preferably not higher than 5% by weight. The heat loss and dehydration initiation temperature are as defined in the first embodiment.

The third embodiment of the special mixture which serves as a flame retardant will be described hereinafter. The third embodiment comprises the compositions as used in the cases a and b of the first embodiment, the compositions as used in the second embodiment, and an organic flame retardant in combination.

As the organic flame retardant there may be used a heterocyclic compound.

Examples of the heterocyclic compound include compounds having melamine, melamine cyanurate, phosphazene and cyanuric acid skeletons. These heterocyclic compounds may be used singly or in combination.

The organic flame retardant may be mechanically mixed with the metal hydroxide and composite metal hydroxide before being incorporated in the thermosetting resin composition. Alternatively, the metal hydroxide and composite metal hydroxide may be added to a solution of the organic flame retardant in a solvent. The solution may be then desolvented so that the metal hydroxide and composite metal hydroxide are subjected to surface treatment.

The content of the organic flame retardant is preferably determined to be 1 to 10% by weight, particularly 1.0 to 5.0% by weight, of the content of the metal hydroxides and composite metal hydroxides represented by the general formulae (1), (3) and (4).

It can be thought that in the third embodiment comprising a metal hydroxide (including composite metal hydroxide) or metal oxide, the additional use of the organic flame retardant exerts an effect of stabilizing active radical generated by thermal decomposition reaction caused by combustion to inhibit thermal decomposition reaction. As a result, this mixture can serve as a flame retardant.

The thermosetting resin composition used in the present invention may comprise an inorganic filler, a hardening accelerator, a pigment, a release agent, a flexibilizer, etc. incorporated therein as necessary besides the above components.

Examples of the inorganic filler include quartz glass powder, talc, silica powder, alumina powder, calcium carbonate powder, and carbon black powder. Particularly preferred among these inorganic fillers is silica powder. The content of the inorganic filler, if it is silica powder, is preferably determined such that the total amount of inorganic matters (i.e., total amount of metal hydroxides, metal oxides and inorganic fillers) is not lower than 60% by weight, particularly not lower than 70% by weight (normal upper limit is 93% by weight), based on the total weight of the thermosetting resin composition. In other words, if the total amount of inorganic matters is below 60% by weight, it tends to reduce the flame retardance.

Examples of the pigment include carbon black, and titanium oxide.

Examples of the release agent include paraffin, and aliphatic ester.

Examples of the flexibilizer include coupling agents such as silane coupling agent, silicone resins, and butadiene-acrylonitrile rubbers.

The metal hydroxides (composite metal hydroxides) represented by the general formulae (1), (3), (4) and (5) and the metal oxide represented by the general formula (2) are particulate matters. These particulate matters preferably have an average grain diameter of 0.1 to 30 µm as determined by means of a laser granulometer.

The thermosetting resin composition of the present invention can be prepared in the following manner. In some detail, the thermosetting resin (Component I), the hardener (Component II), the special mixture which serves as a flame retardant in the first, second and third embodiments, and optionally other additives are mixed in a predetermined proportion. The mixture is then melt-kneaded at an elevated temperature by means of a kneader such as mixing roll. The material is then cooled to room temperature. The material is then ground by a known means, optionally followed by pelletization. In this continuous process, the desired thermosetting resin composition can be prepared.

The method for encapsulating a semiconductor element with the thermosetting resin composition thus obtained is not specifically limited. A known molding method such as ordinary transfer molding can be used.

BEST EMBODIMENT FOR PRACTICING THE INVENTION

Examples of the present invention will be described along with comparative examples.

(a) The first embodiment wherein the metal hydroxide represented by the general formula (1) and the metal oxide represented by the general formula (2) will be described hereinafter.

The following metal hydroxides and metal oxides were synthesized prior to the example.

Metal Hydroxide AH 750.26 g (2 mol) of aluminum nitrate [nonahydrate] was dissolved in 2 l of distilled water. A concentrated aqueous ammonia was then added dropwise to the solution with stirring. The mixture was then stirred at room temperature for 1 hour. The resulting precipitate was recovered by filtration, and then washed with distilled water five times. The solid matter thus obtained was dried by hot air at a temperature of 120° C. for 10 hours, and then dried at a temperature of 210° C. under reduced pressure for 10 hours. Thus, a metal hydroxide AH having the following composition formula:

$$Al_2O_3.3H_2O$$

was synthesized.

Metal Hydroxides BH, CH

Metal hydroxides BH to DH shown in Tables 1 and 2 below were synthesized in the same manner as in the metal hydroxide AH except that the inorganic reagents shown in Tables 1 and 2 were used in amounts shown in Tables 1 and 2. The heat loss at 150° C. and dehydration initiation temperature of the metal hydroxides AH to DH thus obtained are shown in Table 3.

Metal Hydroxide DH

A metal hydroxide DH was prepared by heating $Al_2O_3.3H_2O$ as the metal hydroxide AH to a temperature of 260° C. that $2H_2O$ was removed. The heat loss at 150° C. and dehydration initiation temperature of the metal hydroxides DH thus obtained are shown in Table 3.

TABLE 1

|    | First metal salt | Amount added (mol) |
|----|------------------|--------------------|
| AH | $Al(NO_3)_3.9H_2O$ | 2.0 |
| BH | $Mg(NO_3)_2.6H_2O$ | 2.0 |
| CH | $Ca(NO_3)_2.6H_2O$ | 2.0 |
| DH | $Al(NO_3)_3.9H_2O$ | 2.0 |

TABLE 2

|    | Composition formula |
|----|---------------------|
| AH | $Al_2O_3.3H_2O$ |
| BH | $MgO.1H_2O$ |
| CH | $CaO.1H_2O$ |
| DH | $Al_2O_3.1H_2O$ |

TABLE 3

| | Heat loss at 150° C. (wt %) | Dehydration initiation temperature (°C.) |
|---|---|---|
| AH | 2 | 220 |
| BH | 0 | 340 |
| CH | 0 | 450 |
| DH | 0 | 480 |

Metal Oxide AO 581.6 g (2 mol) of nickel nitrate [hexahydrate] was dissolved in 2 l of distilled water. A concentrated aqueous ammonia was then added dropwise to the solution with stirring. The mixture was then stirred at room temperature for 1 hour. The resulting precipitate was recovered by filtration, and then washed with distilled water five times. The solid matter thus obtained was dried by hot air at a temperature of 120° C. for 10 hours, and then dried at a temperature of 900° C. under reduced pressure for 10 hours. Thus, a metal hydroxide AO having the following composition formula:

$$NiO$$

was synthesized.

Metal Oxides BO, CO

Metal oxides BO and CO were synthesized in the same manner as in the metal oxide AO except that the inorganic reagents shown in Table 4 below were used in amounts shown in Table 4. The composition formulae of the metal oxides BO and CO thus synthesized are shown in Table 5 below.

Metal Oxide DO 461.54 g (1.8 mol) of magnesium nitrate [hexahydrate] and 58.16 g (0.2 mol) of nickel nitrate [hexahydrate] were dissolved in 2 l of distilled water. A concentrated aqueous ammonia was then added dropwise to the solution with stirring. The mixture was then stirred at room temperature for 1 hour. The resulting precipitate was recovered by filtration, and then washed with distilled water five times. The solid matter thus obtained was dried by hot air at a temperature of 120° C. for 10 hours, and then dried at a temperature of 900° C. under reduced pressure for 10 hours. Thus, a metal oxide CO having the following composition formula:

$$(MgO)_{1.8} \cdot (NiO)_{0.2}$$

was synthesized.

Metal Oxides EO, FO

Metal oxides EO and FO were synthesized in the same manner as in the metal oxide CO except that the inorganic reagents shown in Table 4 below were used in amounts shown in Table 4. The composition formulae of the metal oxides EO and FO thus synthesized are shown in Table 5 below.

TABLE 4

| | First metal salt | Amount added (mol) | Second metal salt | Amount added (mol) |
|---|---|---|---|---|
| AO | $Ni(NO_3)_2 \cdot 6H_2O$ | 2.0 | — | |
| BO | $Co(NO_3)_2 \cdot 6H_2O$ | 2.0 | — | |
| CO | $Fe(NO_3)_2 \cdot 9H_2O$ | 2.0 | — | |
| DO | $Mg(NO_3)_2 \cdot 6H_2O$ | 1.8 | $Ni(NO_3)_2 \cdot 6H_2O$ | 0.2 |
| EO | $Ni(NO_3)_2 \cdot 6H_2O$ | 1.0 | $Fe(NO_3)_3 \cdot 9H_2O$ | 1.0 |
| FO | $Co(NO_3)_2 \cdot 6H_2O$ | 1.0 | $Cu(NO_3)_2 \cdot 3H_2O$ | 1.0 |

TABLE 5

| | Composition formula |
|---|---|
| AO | NiO |
| BO | CoO |
| CO | $Fe_2O_3$ |
| DO | $(MgO)_{1.8} \cdot (NiO)_{0.2}$ |
| EO | $NiO \cdot Fe_2O_3$ |
| FO | $CoO \cdot CuO$ |

EXAMPLES 1 TO 13, COMPARATIVE EXAMPLES 1 TO 9

Various components shown in Tables 6 to 10 below were mixed in proportions shown in Tables 6 to 10. The mixtures were each melt-kneaded by means of a mixing roll (temperature: 100° C.) for 3 minutes, and then cooled and solidified. The solid matters were each then ground to obtain desired powdered thermosetting resin compositions.

TABLE 6

(Case a of first embodiment) (parts by weight)

| | Example | | | | |
|---|---|---|---|---|---|
| | 1 | 2 | 3 | 4 | 5 |
| Epoxy resin*1 | 63.49 | 63.49 | 63.49 | 63.49 | 63.49 |
| Epoxy resin hardener*2 | 34.51 | 34.51 | 34.51 | 34.51 | 34.51 |
| Metal hydroxide a | | | | | |
| Kind | AH | AH | BH | AH | DH |
| Amount | 80.0 | 70.0 | 150.0 | 100.0 | 150.0 |
| Metal hydroxide b | | | | | |
| Kind | BH | CH | — | — | — |
| Amount | 80.0 | 30.0 | — | — | — |
| Metal oxide | | | | | |
| Kind | AO | BO | AO | CO | BO |
| Amount | 240.0 | 300.0 | 50.0 | 100.0 | 50.0 |
| Triphenylphosphine | 1.0 | 1.0 | 1.0 | 1.0 | 1.0 |
| Carnauba wax | 1.0 | 1.0 | 1.0 | 1.0 | 1.0 |
| Silica powder | 0 | 0 | 200.0 | 200.0 | 200.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 7

(Case a of first embodiment) (parts by weight)

| | Example | | |
|---|---|---|---|
| | 6 | 7 | 8 |
| Epoxy resin*1 | 63.49 | 63.49 | 63.49 |
| Epoxy resin | 34.51 | 34.51 | 34.51 |

TABLE 7-continued (Case a of first embodiment)

(parts by weight)

| | Example | | |
|---|---|---|---|
| | 6 | 7 | 8 |
| hardener*2 | | | |
| Metal hydroxide a | | | |
| Kind | CH | AH | AH |
| Amount | 100.0 | 150.0 | 150.0 |
| Metal hydroxide b | | | |
| Kind | — | — | — |
| Amount | — | — | — |
| Metal oxide a | | | |
| Kind | AO | EO | FO |
| Amount | 100.0 | 50.0 | 50.0 |
| Triphenylphosphine | 1.0 | 1.0 | 1.0 |
| Carnauba wax | 1.0 | 1.0 | 1.0 |
| Silica powder | 200.0 | 200.0 | 200.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 8

(Case a of first embodiment)

(parts by weight)

| | Example | | | | |
|---|---|---|---|---|---|
| | 9 | 10 | 11 | 12 | 13 |
| Polymaleimide resin*1 | 74.85 | 74.85 | 74.85 | 74.85 | 74.85 |
| Allylated phenol resin*2 | 22.65 | 22.65 | 22.65 | 22.65 | 22.65 |
| Metal hydroxide a | | | | | |
| Kind | AH | BH | DH | DH | DH |
| Amount | 70.0 | 100.0 | 100.0 | 200.0 | 30.0 |
| Metal hydroxide b | | | | | |
| Kind | CH | — | — | — | — |
| Amount | 30.0 | — | — | — | — |
| Metal oxide | | | | | |
| Kind | BO | AO | AO | AO | CO |
| Amount | 300.0 | 300.0 | 300.0 | 200.0 | 200.0 |
| Triphenylphosphine | 1.5 | 1.5 | 1.5 | 1.5 | 1.5 |
| Carnauba wax | 1.0 | 1.0 | 1.0 | 1.0 | 1.0 |
| Silica powder | — | — | — | — | — |

*1: N,N'-(4,4'-diphenylmethane)bismaleimide
*2: Allylated phenol novolak resin (allyl equivalent: 280; softening point: 90° C.)

TABLE 9

(parts by weight)

| | Comparative Example | | | | |
|---|---|---|---|---|---|
| | 1 | 2 | 3 | 4 | 5 |
| Epoxy resin*1 | 54.56 | — | 63.49 | 63.49 | 63.49 |
| Epoxy resin hardener*2 | 33.44 | — | 34.51 | 34.51 | 34.51 |
| Brominated epoxy resin*3 | 10.0 | 15.0 | — | — | — |
| Polymaleimide resin*4 | — | 74.85 | — | — | — |
| Allylated phenol resin*4 | — | 22.85 | — | — | — |
| Metal hydroxide a | | | | | |
| Kind | — | — | AH | AH | BH |
| Amount | — | — | 490.0 | 60.0 | 125.0 |
| Metal oxide | | | | | |
| Kind | — | — | — | — | — |
| Amount | — | — | — | — | — |
| Triphenylphosphine | 1.0 | 1.7 | 1.0 | 1.0 | 1.0 |
| Carnauba wax | 1.0 | 1.0 | 1.0 | 1.0 | 1.0 |
| Antimony trioxide | 10.0 | 15.0 | — | — | — |
| Silica powder | 390.0 | 440.0 | — | — | 125.0 |

*1: o-Cresol novolak epoxy resin (epoxy equivalent: 195; softening point: 85° C.)
*2: Phenol novolak resin (hydroxyl equivalent: 106; softening point: 80° C.)
*3: Brominated phenol novolak epoxy resin (epoxy equivalent: 280; softening point: 83° C.)
*4: N,N'-(4,4'-diphenylmethane)bismaleimide
*5: Allylated phenol novolak resin (allyl equivalent: 280; softening point: 90° C.)

Note: Comparative Examples 3 to 5 are comparative examples in the case a of the first embodiment.

TABLE 10

(parts by weight)

| | Comparative Example | | | |
|---|---|---|---|---|
| | 6 | 7 | 8 | 9 |
| Epoxy resin*1 | 54.56 | 63.49 | 63.49 | 63.49 |
| Epoxy resin hardener*2 | 33.44 | 34.51 | 34.51 | 34.51 |
| Brominated epoxy resin*3 | 10.0 | — | — | — |
| Polymaleimide resin*4 | — | — | — | — |
| Allylated phenol resin*4 | — | — | — | — |
| Metal hydroxide | | | | |
| Kind | BH | BH | AH | — |
| Amount | 180.0 | 50.0 | 100.0 | — |
| Metal oxide | | | | |
| Kind | — | — | — | AO |
| Amount | — | — | — | 100.0 |
| Triphenylphosphine | 1.0 | 1.0 | 1.0 | 1.0 |
| Carnauba wax | 1.0 | 1.0 | 1.0 | 1.0 |
| Antimony trioxide | 10.0 | 10.0 | 10.0 | 10.0 |
| Silica powder | 210.0 | 200.0 | 200.0 | 200.0 |

*1: o-Cresol novolak epoxy resin (epoxy equivalent: 195; softening point: 85° C.)
*2: Phenol novolak resin (hydroxyl equivalent: 106; softening point: 80° C.)
*3: Brominated phenol novolak epoxy resin (epoxy equivalent: 280; softening point: 83° C.)
*4: N,N'-(4,4'-diphenylmethane)bismaleimide
*5: Allylated phenol novolak resin (allyl equivalent: 280; softening point: 90° C.)

Note: Comparative Examples 6 to 8 are comparative examples in the case a of the first embodiment.

(b) The first embodiment wherein as the metal hydroxide represented by the general formula (1) there is used at least one of composite metal hydroxides represented by the formulae (3) and (4), in combination with the metal hydroxide represented by the general formula (5), will be described hereinafter.

The following composite metal hydroxide was synthesized prior to the example.

Composite Metal Hydroxide FH 375.13 g (1 mol) of aluminum nitrate [nonahydrate] and 256.14 g (1 mol) of magnesium nitrate [hexahydrate] were dissolved in 2 l of distilled water. A concentrated aqueous ammonia was then added dropwise to the solution with stirring. The mixture was then stirred at room temperature for 1 hour. The resulting precipitate was recovered by filtration, and then washed with distilled water five times. The solid matter thus obtained was dried by hot air at a temperature of 120° C. for 10 hours, and then dried at a temperature of 210° C. under reduced pressure for 10 hours. Thus, a composite metal hydroxide DH having the following composition formula:

$(Al_2O_3)_{0.5} \cdot (MgO)_{1.0} \cdot 2.5H_2O$ was synthesized.

Composite Metal Hydroxides GH to QH

Composite metal hydroxides GH to QH having compositions shown in Table 12 below were synthesized in the same manner as in the composite metal hydroxide FH except that the inorganic reagents shown in Table 11 below were used in amounts shown in Table 11.

The heat loss at 150° C. and dehydration initiation temperature of the composite metal hydroxides FH to QH thus obtained are shown in Table 13 below.

TABLE 13

|    | Heat loss at 150° C. (wt %) | Dehydration initiation temperature (°C.) |
|----|-----------------------------|------------------------------------------|
| FH | 2 | 240 |
| GH | 0 | 320 |
| HH | 1 | 310 |
| IH | 0 | 320 |
| JH | 0 | 310 |
| KH | 0 | 260 |
| LH | 0 | 360 |
| MH | 2 | 240 |
| NH | 1 | 300 |
| OH | 1 | 360 |
| PH | 2 | 300 |
| QH | 1 | 320 |

EXAMPLES 14 TO 33

Various components shown in Tables 14 to 19 below were mixed in proportions shown in Tables 14 to 19. The mixtures were each melt-kneaded by means of a mixing roll (temperature: 100° C.) for 3 minutes, and then cooled and solidified. The solid matters were each then ground to obtain desired powdered thermosetting resin compositions.

TABLE 11

|    | First metal salt | Amount added (mol) | Second metal salt | Amount added (mol) | Third metal salt | Amount added (mol) |
|----|------------------|--------------------|-------------------|--------------------|------------------|---------------------|
| FH | $Al(NO_3)_3 \cdot 9H_2O$ | 1.0 | $Mg(NO_3)_2 \cdot 6H_2O$ | 1.0 | — | — |
| GH | $Mg(NO_3)_2 \cdot 6H_2O$ | 1.8 | $Ni(NO_3)_2 \cdot 6H_2O$ | 0.2 | — | — |
| HH | $Mg(NO_3)_2 \cdot 6H_2O$ | 1.5 | $Fe(NO_3)_2 \cdot 6H_2O$ | 0.5 | — | — |
| IH | $Mg(NO_3)_2 \cdot 6H_2O$ | 0.6 | $Ni(NO_3)_2 \cdot 6H_2O$ | 0.4 | — | — |
| JH | $Mg(NO_3)_2 \cdot 6H_2O$ | 0.8 | $Fe(NO_3)_2 \cdot 9H_2O$ | 0.2 | — | — |
| KH | $Al(NO_3)_2 \cdot 9H_2O$ | 0.8 | $Co(NO_3)_2 \cdot 6H_2O$ | 0.2 | — | — |
| LH | $Ca(NO_3)_2 \cdot 4H_2O$ | 0.6 | $Fe(NO_3)_3 \cdot 9H_2O$ | 0.4 | — | — |
| MH | $Al(NO_3)_3 \cdot 9H_2O$ | 2.0 | $Ni(NO_3)_2 \cdot 6H_2O$ | 1.0 | — | — |
| NH | $Mg(NO_3)_2 \cdot 6H_2O$ | 1.6 | $Co(NO_3)_2 \cdot 6H_2O$ | 0.2 | $Ni(NO_3)_2 \cdot 6H_2O$ | 0.2 |
| OH | $Ca(NO_3)_2 \cdot 4H_2O$ | 1.8 | $Zn(NO_3)_2 \cdot 6H_2O$ | 0.2 | $Cu(NO_3)_2 \cdot 3H_2O$ | 0.1 |
| PH | $Al(NO_3)_3 \cdot 9H_2O$ | 0.5 | $Ca(NO_3)_2 \cdot 6H_2O$ | 1.0 | $SnCl_4$ | 0.5 |
| QH | $Mg(NO_3)_2 \cdot 6H_2O$ | 1.5 | $TiCl_4$ | 0.25 | $Pd(NO_3)_2$ | 0.25 |

TABLE 12

|    | Composition formula |
|----|---------------------|
| FH | $(Al_2O_3)_{0.5} \cdot (MgO) \cdot 2.5H_2O$ |
| GH | $(MgO)_{1.8} \cdot (NiO)_{0.2} \cdot 1.7H_2O$ |
| HH | $(MgO)_{1.5} \cdot (Fe_2O_3)_{0.25} \cdot 2.1H_2O$ |
| IH | $(MgO)_{0.6} \cdot (NiO)_{0.4} \cdot 1H_2O$ |
| JH | $(MgO)_{0.8} \cdot (Fe_2O_3)_{0.1} \cdot 1.1H_2O$ |
| KH | $(Al_2O_3)_{0.4} \cdot (CoO)_{0.2} \cdot 1.4H_2O$ |
| LH | $(CaO)_{0.6} \cdot (Fe_2O_3)_{0.2} \cdot 1.2H_2O$ |
| MH | $(Al_2O_3) \cdot (NiO) \cdot 1H_2O$ |
| NH | $(MgO)_{1.6} \cdot (CoO)_{0.2} \cdot (NiO)_{0.2} \cdot 1.5H_2O$ |
| OH | $(CaO)_{1.8} \cdot (ZnO)_{0.1} \cdot (CuO)_{0.1} \cdot 1.7H_2O$ |
| PH | $(Al_2O_3)_{0.25} \cdot (CaO) \cdot (SnO_2)_{0.5} \cdot 3.1H_2O$ |
| QH | $(MgO)_{1.5} \cdot (TiO_2)_{0.25} \cdot (PdO)_{0.25} \cdot 1.9H_2O$ |

TABLE 14

(Case b of first embodiment)

|  | Example (parts by weight) | | | | |
|---|---|---|---|---|---|
|  | 14 | 15 | 16 | 17 | 18 |
| Epoxy resin*1 | 63.49 | 63.49 | 63.49 | 63.49 | 63.49 |
| Epoxy resin hardener*2 | 34.51 | 34.51 | 34.51 | 34.51 | 34.51 |
| Metal hydroxide a | | | | | |
| Kind | FH | CH | IH | JH | KH |
| Amount | 200.0 | 200.0 | 100.0 | 150.0 | 150.0 |
| Metal hydroxide b | | | | | |
| Kind | — | FH | — | — | — |
| Amount | — | 100.0 | — | — | — |

TABLE 14-continued (Case b of first embodiment)

(parts by weight)

| | Example | | | | |
|---|---|---|---|---|---|
| | 14 | 15 | 16 | 17 | 18 |
| Metal oxide | | | | | |
| Kind | CO | BO | BO | AO | CO |
| Amount | 200.0 | 50.0 | 100.0 | 50.0 | 50.0 |
| Triphenylphosphine | 1.0 | 1.0 | 1.0 | 1.0 | 1.0 |
| Carnauba wax | 1.0 | 1.0 | 1.0 | 1.0 | 1.0 |
| Silica powder | 0 | 0 | 200.0 | 200.0 | 200.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 15

(Case b of first embodiment)

(parts by weight)

| | Example | | | | |
|---|---|---|---|---|---|
| | 19 | 20 | 21 | 22 | 23 |
| Epoxy resin*1 | 63.49 | 63.49 | 63.49 | 63.49 | 63.49 |
| Epoxy resin hardener*2 | 34.51 | 34.51 | 34.51 | 34.51 | 34.51 |
| Metal hydroxide a | | | | | |
| Kind | LH | MH | BH | NH | PH |
| Amount | 50.0 | 50.0 | 30.0 | 100.0 | 100.0 |
| Metal hydroxide b | | | | | |
| kind | — | — | QH | — | — |
| Amount | — | — | 30.0 | — | — |
| Metal oxide | | | | | |
| Kind | DO | EO | AO | BO | AO |
| Amount | 150.0 | 150.0 | 100.0 | 100.0 | 50.0 |
| Triphenylphosphine | 1.0 | 1.0 | 1.0 | 1.0 | 1.0 |
| Carnauba wax | 1.0 | 1.0 | 1.0 | 1.0 | 1.0 |
| Silica powder | 200.0 | 200.0 | 65.0 | 200.0 | 100.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 16

(Case b of first embodiment)

(parts by weight)

| | Example | | |
|---|---|---|---|
| | 24 | 25 | 26 |
| Polymaleimide resin*1 | 74.85 | 74.85 | 74.85 |
| Allylated phenol resin*2 | 22.65 | 22.65 | 22.65 |
| Metal hydroxide a | | | |
| Kind | FH | GH | HH |
| Amount | 300.0 | 150.0 | 150.0 |
| Metal hydroxide b | | | |
| Kind | — | — | — |
| Amount | — | — | — |
| Metal oxide | | | |
| Kind | CO | EO | FO |
| Amount | 100.0 | 150.0 | 150.0 |

TABLE 16-continued (Case b of first embodiment)

(parts by weight)

| | Example | | |
|---|---|---|---|
| | 24 | 25 | 26 |
| Triphenylphosphine | 1.5 | 1.5 | 1.5 |
| Carnauba wax | 1.0 | 1.0 | 1.0 |
| Silica powder | — | — | — |

*1: N,N'-(4,4'-diphenylmethane)bismaleimide
*2: Allylated phenol novolak resin (allyl equivalent: 280; softening point: 90° C.)

TABLE 17

(Case b of first embodiment)

(parts by weight)

| | Example | | |
|---|---|---|---|
| | 27 | 28 | 29 |
| Polymaleimide resin*1 | 74.85 | 74.85 | 74.85 |
| Allylated phenol resin*2 | 22.65 | 22.65 | 22.65 |
| Metal hydroxide a | | | |
| Kind | AH | QH | PH |
| Amount | 100.0 | 300.0 | 300.0 |
| Metal hydroxide b | | | |
| Kind | NH | — | — |
| Amount | 100.0 | — | — |
| Metal oxide a | | | |
| Kind | AO | EO | FO |
| Amount | 100.0 | 100.0 | 100.0 |
| Metal oxide b | | | |
| Kind | CO | — | — |
| Amount | 100.0 | — | — |
| Triphenylphosphine | 1.5 | 1.5 | 1.5 |
| Carnauba wax | 1.0 | 1.0 | 1.0 |
| Silica powder | — | — | — |

*1: N,N'-(4,4'-diphenylmethane)bismaleimide
*2: Allylated phenol novolak resin (allyl equivalent: 280; softening point: 90° C.)

TABLE 18

(Case b of first embodiment)

(parts by weight)

| | Example | |
|---|---|---|
| | 30 | 31 |
| Epoxy resin*1 | 63.49 | 63.49 |
| Epoxy resin hardener*2 | 34.51 | 34.51 |
| Metal hydroxide a | | |
| Kind | IH | JH |
| Amount | 100.0 | 100.0 |
| Metal hydroxide b | | |
| Kind | PH | QH |
| Amount | 50.0 | 50.0 |
| Metal oxide | | |
| Kind | AO | BO |
| Amount | 50.0 | 50.0 |
| Triphenylphosphine | 1.0 | 1.0 |
| Carnauba wax | 1.0 | 1.0 |

TABLE 18-continued (Case b of first embodiment)

| | Example | (parts by weight) |
|---|---|---|
| | 30 | 31 |
| Silica powder | 200.0 | 200.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 19

(Case b of first embodiment)

| | Example | (parts by weight) |
|---|---|---|
| | 32 | 33 |
| Polymaleimide resin*1 | 74.85 | 74.85 |
| Allylated phenyl resin*2 | 22.65 | 22.65 |
| Metal hydroxide a | | |
| Kind | HH | JH |
| Amount | 200.0 | 150.0 |
| Metal hydroxide b | | |
| Kind | PH | QH |
| Amount | 100.0 | 150.0 |
| Metal oxide | | |
| Kind | AO | BO |
| Amount | 100.0 | 100.0 |
| Triphenylphosphine | 1.5 | 1.5 |
| Carnauba wax | 1.0 | 1.0 |
| Silica powder | — | — |

*1: N,N'-(4,4'-diphenylmethane)bismaleimide
*2: Allylated phenol novolak resin (allyl equivalent: 280; softening point: 90° C.)

(c) The second embodiment comprising the use of at least one of composite metal hydroxides represented by the formulae (3) and (4) will be described hereinafter.

EXAMPLES 34 TO 45

Various components shown in Tables 20 to 22 below were mixed in proportions shown in Tables 20 to 22. The mixtures were each melt-kneaded by means of a mixing roll (temperature: 100° C.) for 3 minutes, and then cooled and solidified. The solid matters were each then ground to obtain desired powdered thermosetting resin compositions.

TABLE 20

(Second embodiment)

| | Example | | | | (parts by weight) |
|---|---|---|---|---|---|
| | 34 | 35 | 36 | 37 | 38 |
| Epoxy resin*1 | 63.49 | 63.49 | 63.49 | 63.49 | 63.49 |
| Epoxy resin hardener*2 | 34.51 | 34.51 | 34.51 | 34.51 | 34.51 |
| Metal hydroxide a | | | | | |
| Kind | GH | HH | IH | NH | OH |
| Amount | 400.0 | 200.0 | 100.0 | 200.0 | 150.0 |
| Metal hydroxide b | | | | | |
| Kind | — | — | — | — | — |
| Amount | — | — | — | — | — |
| Metal oxide | | | | | |
| Kind | — | — | — | — | — |
| amount | — | — | — | — | — |
| Triphenylphosphine | 1.0 | 1.0 | 1.0 | 1.0 | 1.0 |
| Carnauba wax | 1.0 | 1.0 | 1.0 | 1.0 | 1.0 |
| Silica powder | 0 | 200.0 | 300.0 | 200.0 | 250.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 21

(Second embodiment)

| | Example | | (parts by weight) |
|---|---|---|---|
| | 39 | 40 | 41 |
| Epoxy resin*1 | 63.49 | 63.49 | 63.49 |
| Epoxy resin hardener*2 | 34.51 | 34.51 | 34.51 |
| Metal hydroxide a | | | |
| Kind | PH | IH | GH |
| Amount | 75.0 | 100.0 | 150.0 |
| Metal hydroxide b | | | |
| Kind | — | NH | OH |
| Amount | — | 100.0 | 50.0 |
| Metal oxide | | | |
| Kind | — | — | — |
| amount | — | — | — |
| Triphenylphosphine | 1.0 | 1.0 | 1.0 |
| Carnauba wax | 1.0 | 1.0 | 1.0 |
| Silica powder | 325.0 | 200.0 | 200.0 |

*1: o-Cresol novolak epoxy resin (epoxy equivalent: 195; softening point: 85° C.)
*2: Phenol novolak resin (hydroxyl equivalent: 106; softening point: 80° C.)

TABLE 22

(Second embodiment)

| | Example | | | (parts by weight) |
|---|---|---|---|---|
| | 42 | 43 | 44 | 45 |
| Polymaleimide resin*1 | 74.85 | 74.85 | 74.85 | 74.85 |
| Allylated phenol resin*2 | 22.65 | 22.65 | 22.65 | 22.65 |
| Metal hydroxide a | | | | |
| Kind | NH | OH | GH | GH |
| Amount | 400.0 | 400.0 | 200.0 | 300.0 |
| Metal hydroxide b | | | | |
| Kind | — | — | NH | OH |

TABLE 22-continued (Second embodiment)

| | Example (parts by weight) | | | |
|---|---|---|---|---|
| | 42 | 43 | 44 | 45 |
| Amount Metal oxide a | — | — | 200.0 | 100.0 |
| Kind Amount Metal oxide b | — | — | — | — |
| Kind Amount | — | — | — | — |
| Triphenylphosphine | 1.5 | 1.5 | 1.5 | 1.5 |
| Carnauba wax | 1.0 | 1.0 | 1.0 | 1.0 |
| Silica powder | — | — | — | — |

*1: N,N'-(4,4'-diphenylmethane)bismaleimide
*2: Allylated phenol novolak resin (allyl equivalent: 280; softening point: 90° C.)

(d) The third embodiment comprising the use of metal hydroxides and metal oxides as well as organic flame retardants (heterocyclic compounds) will be described hereinafter.

EXAMPLES 46 TO 50

Various components shown in Table 23 below were mixed in proportions shown in Table 23. The mixtures were each melt-kneaded by means of a mixing roll (temperature: 100° C.) for 3 minutes, and then cooled and solidified. The solid matters were each then ground to obtain desired powdered thermosetting resin compositions.

TABLE 23

(Third embodiment)

| | Example (parts by weight) | | | | |
|---|---|---|---|---|---|
| | 46 | 47 | 48 | 49 | 50 |
| Epoxy resin*1 | 63.49 | 63.49 | 63.49 | 63.49 | 63.49 |
| Epoxy resin hardener*2 | 34.51 | 34.51 | 34.51 | 34.51 | 34.51 |
| Metal hydroxide | | | | | |
| Kind | AH | BH | HH | NH | IH |
| Amount | 150.0 | 100.0 | 150.0 | 100.0 | 50.0 |
| Metal oxide | | | | | |
| Kind | AO | EO | — | — | DO |
| Amount | 50.0 | 100.0 | — | — | 50.0 |
| Organic flame retardant | | | | | |
| C*3 | 2.0 | 4.0 | 15.0 | — | — |
| D*4 | — | — | — | 5.0 | 1.0 |
| Triphenylphosphine | 1.0 | 1.0 | 1.0 | 1.0 | 1.0 |
| Carnauba wax | 1.0 | 1.0 | 1.0 | 1.0 | 1.0 |
| Silica powder | 200.0 | 200.0 | 250.0 | 300.0 | 300.0 |

*1: o-Cresol novolak epoxy resin (epoxy equivalent: 195; softening point: 85° C.)
*2: Phenol novolak resin (hydroxyl equivalent: 106; softening point:. 80° C.)
*3: Melamine
*4: Melamine cyanurate A semiconductor element was transfer-molded in the thermosetting resin compositions obtained in the above-described examples and comparative examples (conditions: 175° C.×2 minutes), and then postcured at a temperature of 175° C. for 5 hours to obtain a semiconductor device. This package was a 80-pin QFP (quad flood package; size: 20×14×2 mm). The die pad size was 8×8 mm.

The semiconductor device thus obtained was then allowed to stand in a 85° C./85% RH constant temperature bath for 96 hours so that it absorbed moisture. The semiconductor device was then subjected to infrared reflow at an elevated temperature of 240° C. for 90 seconds to evaluate the heat resistance thereof at reflow step. Further, the semiconductor device was allowed to stand at a temperature of 200° C. The time at which 50% failure was reached was measured to conduct a high temperature test. Moreover, a 1/16 inch-thick specimen was formed. The specimen was then evaluated for flame retardance in accordance with UL94-V0. The results are shown in Tables 24 to 32 below.

The cured product of the thermoplastic resin compositions obtained in the above examples and comparative examples were measured for chlorine ion concentration. The measurement of chlorine ion concentration was conducted in accordance with the method defined above. The results are shown in Tables 24 to 32.

TABLE 24

| | Example | | | | | | |
|---|---|---|---|---|---|---|---|
| | 1 | 2 | 3 | 4 | 5 | 6 | 7 |
| Flame retardance (UL94-V0) | V0 | V0 | V0 | V0 | V0 | V0 | V0 |
| High temperature (200° C.): 50% failure (hour) | 590 | 740 | 500 | 630 | 650 | 690 | 650 |
| Occurrence of crack at infrared reflow test (crack/100) | 1 | 0 | 0 | 0 | 0 | 0 | 1 |
| Chlorine ion concentration in resin composition (ppm) | 90 | 20 | 100 | 20 | 10 | 20 | 25 |

TABLE 25

| | Example | | | | | | |
|---|---|---|---|---|---|---|---|
| | 8 | 9 | 10 | 11 | 12 | 13 | 14 |
| Flame retardance (UL94-V0) | V0 | V0 | V0 | V0 | V0 | V0 | V0 |
| High temperature (200° C.): 50% failure (hour) | 700 | 730 | 500 | 510 | 650 | 640 | 680 |
| Occurrence of crack at infrared reflow test (crack/100) | 1 | 0 | 2 | 1 | 0 | 1 | 2 |
| Chlorine ion concentration in resin composition (ppm) | 25 | 17 | 95 | 15 | 25 | 15 | 45 |

TABLE 26

| | Example | | | | | | |
|---|---|---|---|---|---|---|---|
| | 15 | 16 | 17 | 18 | 19 | 20 | 21 |
| Flame retardance (UL94-V0) | V0 | V0 | V0 | V0 | V0 | V0 | V0 |
| High temperature (200° C.): 50% failure (hour) | 600 | 650 | 710 | 750 | 740 | 700 | 810 |
| Occurrence of crack at infrared reflow test (crack/100) | 0 | 0 | 0 | 1 | 0 | 0 | 0 |
| Chlorine ion | 70 | 40 | 70 | 20 | 20 | 15 | 70 |

TABLE 26-continued

| | Example | | | | | | |
|---|---|---|---|---|---|---|---|
| | 15 | 16 | 17 | 18 | 19 | 20 | 21 |
| concentration in resin composition (ppm) | | | | | | | |

TABLE 27

| | Example | | | | | | |
|---|---|---|---|---|---|---|---|
| | 22 | 23 | 24 | 25 | 26 | 27 | 28 |
| Flame retardance (UL94-VO) | VO | VO | VO | VO | VO | VO | VO |
| High temperature (200° C.): 50% failure (hour) | 750 | 800 | 640 | 720 | 700 | 710 | 640 |
| Occurrence of crack at infrared reflow test (crack/100) | 0 | 0 | 0 | 0 | 0 | 1 | 0 |
| Chlorine ion concentration in resin composition (ppm) | 30 | 20 | 70 | 60 | 50 | 50 | 60 |

TABLE 28

| | Example | | | | | | |
|---|---|---|---|---|---|---|---|
| | 29 | 30 | 31 | 32 | 33 | 34 | 35 |
| Flame retardance (UL94-VO) | VO | VO | VO | VO | VO | VO | VO |
| High temperature (200° C.): 50% failure (hour) | 880 | 680 | 700 | 730 | 760 | 740 | 730 |
| Occurrence of crack at infrared reflow test (crack/100) | 1 | 0 | 0 | 0 | 0 | 0 | 0 |
| Chlorine ion concentration in resin composition (ppm) | 30 | 30 | 60 | 60 | 90 | 100 | 50 |

TABLE 29

| | Example | | | | | | |
|---|---|---|---|---|---|---|---|
| | 36 | 37 | 38 | 39 | 40 | 41 | 42 |
| Flame retardance (UL94-VO) | VO | VO | VO | VO | VO | VO | VO |
| High temperature (200° C.): 50% failure (hour) | 780 | 690 | 700 | 730 | 710 | 680 | 700 |
| Occurrence of crack at infrared reflow test (crack/100) | 0 | 0 | 0 | 0 | 0 | 0 | 0 |
| Chlorine ion concentration in resin composition (ppm) | 20 | 50 | 30 | 10 | 50 | 70 | 95 |

TABLE 30

| | Example | | | | | | | |
|---|---|---|---|---|---|---|---|---|
| | 43 | 44 | 45 | 46 | 47 | 48 | 49 | 50 |
| Flame retardance (UL94-VO) | VO | VO | VO | VO | VO | VO | VO | VO |
| High temperature (200° C.): 50% failure (hour) | 750 | 690 | 710 | 720 | 720 | 720 | 720 | 740 |
| Occurrence of crack at infrared reflow test (crack/100) | 0 | 0 | 0 | 0 | 0 | 0 | 0 | 0 |
| Chlorine ion concentration in resin composition (ppm) | 80 | 100 | 100 | 30 | 100 | 40 | 25 | 20 |

TABLE 31

| | Comparative Example | | | | | |
|---|---|---|---|---|---|---|
| | 1 | 2 | 3 | 4 | 5 | 6 |
| Flame retardance (UL94-VO) | VO | VO | VO | x | x | VO |
| High temperature (200° C.): 50% failure (hour) | 60 | 140 | 610 | 660 | 730 | 100 |
| Occurrence of crack at infrared reflow test (crack/100) | 0 | 0 | 100 | 55 | 0 | 0 |
| Chlorine ion concentration in resin composition (ppm) | 10 | 10 | 60 | 25 | 95 | 95 |

TABLE 32

| | Comparative Example | | |
|---|---|---|---|
| | 7 | 8 | 9 |
| Flame retardance (UL94-VO) | x | VO | x |
| High temperature (200° C.): 50% failure (hour) | 330 | 210 | 420 |
| Occurrence of crack at infrared reflow test (crack/100) | 5 | 2 | 5 |
| Chlorine ion concentration in resin composition (ppm) | 35 | 15 | 10 |

As can be seen in the results shown in Tables 24 to 32 above, the products of Comparative Examples 1, 2 and 6 showed no difficulties in flame retardance but took very little time until 50% failure occurred at the high temperature reliability test, showing a low reliability. The product of Comparative Example 3 showed no difficulties in flame retardance and high temperature reliability but showed a high occurrence of cracking. All the products of Comparative Examples 4, 5, 7 and 9 showed a difficulty in flame retardance. In particular, the product of Comparative Example 4 showed a reduced high temperature reliability and a high occurrence of cracking. On the other hand, all the products of the Examples showed a good conformance with the flame retardance specification, an excellent high temperature reliability and a very low occurrence of cracking, demonstrating that the products of the present invention are excellent in high temperature reliability, heat resistance at reflow step and flame retardance.

As described above, the semiconductor device of the present invention is obtained by encapsulating a semiconductor element with a thermosetting resin composition containing the following compounds as flame retardants. (i) Firstly, a metal hydroxide represented by the general formula (1) and a metal oxide represented by the general formula (2) may be used in combination. (ii) As the metal hydroxide represented by the general formula (1) there may be used at least one of composite metal hydroxides represented by the general formulae (3) and (4). (iii) In addition to at least one of the two composite metal hydroxides, a single metal hydroxide represented by the general formula (5) may be used. (iv) At least one of a composite metal hydroxide having a dehydration initiation temperature of not lower than 260° C. represented by the general formula (3) and a composite metal hydroxide represented by the general formula (4) may be used. (v) In addition to the compositions (i) to (iv), an organic flame retardant may be used. Thus, the use of the compositions (i) to (v) can provide a product which is insusceptible to corrosion of aluminum wiring or dehydration of metal hydroxide even after being allowed to stand at a high temperature, showing an enhanced high temperature reliability and hence a long life. Further, even when the product which had absorbed moisture was dipped in molten solder, it was insusceptible to package cracking. Moreover, since flame retardance can be provided without using any harmful halides or antimony trioxides, a very high safety can be obtained and no environmental pollution occurs. Thus, the semiconductor device of the present invention provides an unharmful flame retarding technique, particularly a technique for drastically enhancing the reliability of the semiconductor device. Therefore, the present invention has an extremely high industrial value.

What is claimed is:

1. A thermosetting resin composition comprising:

(I) a thermosetting resin;

(II) a hardener;

(III) a metal hydroxide represented by the following formula (1):

   (1)

wherein M represents a metallic element; a, b and c each represents a positive number; and n represents a positive number of 1 or more, with the proviso that when $M_aO_b$ is repeated, the plurality of M's may be the same or different and that a and b may be the same or different; and (IV) a metal oxide represented by the following formula (2):

   (2)

wherein Q represents a metallic element selected from the group consisting of Groups IVa, Va, VIa, VIIa, VIII, Ib and IIb in the Periodic Table; d and e each represents a positive number; and n' represents a positive number of 1 or more, with the proviso that when $Q_dO_e$ is repeated, the plurality of Q's may be the same or different and that d and e may be the same or different, wherein the metal hydroxide (III) is at least one selected from the group represented by the following formulae (3) and (4):

   (3)

wherein A and B represent different metallic elements; x, v, a, b, d and e each represents a positive number; and c represents a positive number of more than 1, with the proviso that x, y, a, b, d and e may be the same or different;

   (4)

wherein C, D and E represent different metallic elements; x, v, z, a, b, d, e, f and g each represents a positive number; and c represents a positive number of more than 1, with the proviso that x, y, z, a, b, d, e, f and g may be the same or different, further comprising a metal hydroxide represented by the following formula (5):

   (5)

wherein M represents a metallic element; and a, b and c each represents a positive number, with the proviso that a and b may be the same or different.

2. A thermosetting resin composition for encapsulating semiconductors, comprising the thermosetting resin composition for encapsulating semiconductors as claimed in claim 1 with an organic flame retardant incorporated in the thermosetting resin composition.

* * * * *